(12) United States Patent
Wong et al.

(10) Patent No.: US 7,708,475 B2
(45) Date of Patent: May 4, 2010

(54) ELECTRO-OPTICAL ASSEMBLY AND METHOD FOR MAKING AN ELECTRO-OPTICAL ASSEMBLY

(75) Inventors: Tom Sheau Tung Wong, Singapore (SG); Adrianus J. P. Van Haasteren, Singapore (SG); Tze Wei Lim, Singapore (SG)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 77 days.

(21) Appl. No.: 12/108,898

(22) Filed: Apr. 24, 2008

(65) Prior Publication Data
US 2009/0269075 A1    Oct. 29, 2009

(51) Int. Cl.
*G02B 6/36* (2006.01)
(52) U.S. Cl. .............................. 385/93; 385/14; 385/88; 385/92; 385/94
(58) Field of Classification Search .................. 385/14, 385/88, 92–94; 398/135, 140
See application file for complete search history.

(56) References Cited

U.S. PATENT DOCUMENTS

| 7,044,659 B2 * | 5/2006 | Okada et al. ................... 385/92 |
| 7,474,814 B2 * | 1/2009 | Nagura ......................... 385/14 |

* cited by examiner

*Primary Examiner*—Frank G Font
*Assistant Examiner*—Michael P Mooney

(57) ABSTRACT

An electro-optical assembly (EA) is provided in which the transmitter and receiver components are integrated together on a single circuit board, which is encapsulated in a single molded EA package. Integrating the transmitter and receiver components on a single circuit board allows the size and complexity of the EA to be greatly reduced as compared to the traditional TO-can and FOT architectures. A standard semiconductor inline automation system and process may be used to manufacture the EA packages so that they may be mass produced with improved throughput, yield and quality as compared to the method currently used to manufacture and assemble the known EA used in the traditional TO-can and FOT architectures.

16 Claims, 9 Drawing Sheets

ELECTRO-OPTICAL ASSEMBLY AND METHOD FOR MAKING AN ELECTRO-OPTICAL ASSEMBLY

TECHNICAL FIELD OF THE INVENTION

The invention relates to optical fiber networks over which data is communicated in the form of optical signals transmitted and received over optical waveguides. More particularly, the invention relates to an encapsulated electro-optical assembly.

BACKGROUND OF THE INVENTION

In optical communications networks, electro-optical assemblies are used to transmit and receive optical signals over optical fibers. A typical electro-optical assembly (EA) comprises a transmitter optical subassembly (TOSA), a receiver optical subassembly (ROSA) and an electronic subassembly (ESA). The TOSA and ROSA normally are implemented using traditional transistor outline (TO)-can or fiber optic transceiver (FOT) lead frame architectures. The TOSA and ROSA TO-cans typically each comprise optics that are mounted on top of the TO-can. On the transmitter side, the TOSA TO-can includes a light source that is mounted below the TOSA optics and in optical alignment with the optics. The light source, which is typically a laser diode or light emitting diode (LED), generates modulated optical signals that carry data, which are then coupled by the TOSA optics into an end of an optical fiber for transmission over an optical fiber network. The light source is wire bonded to pins of the TOSA TO-can. The pins of the TOSA TO-can are then soldered to a printed circuit board (PCB) of the ESA. The TOSA FOT includes a light source that is mounted and wire bonded directly on a lead frame, which is encapsulated in a clear mold with a lens. The leads of the FOT lead frame are then soldered to ESA.

The ESA typically also includes a controller IC, a transmitter driver IC, a receiver IC and passive components, such as, for example resistors, capacitors and inductors, all of which are electrically connected to conductors of the PCB of the ESA. The controller IC delivers electrical signals to the transmitter driver IC for controlling the modulation and bias currents of the light source in the TOSA TO-can or FOT.

On the receiver side, a photodiode of the ROSA TO-can is mounted below the ROSA optics in optical alignment with the ROSA optics. The ROSA optics receive an incoming optical signal output from the end of a receive optical fiber and direct the light output from the end of the receive optical fiber onto the active area of the photodiode. The photodiode is wire bonded to pins of the ROSA TO-can. The pins of the ROSA TO-can are soldered to the PCB of the ESA. As for the ROSA FOT, the photodiode is mounted directly on to the lead frame of the ROSA FOT. The leads of ROSA FOT leadframe are then soldered to the PCB of the ESA. During operation, the photodiode converts the incoming optical signal into an electrical signal, which is then processed by the receiver IC and the controller IC of the ESA.

The TO-can and FOT lead frame architectures described above are relatively large and relatively difficult to mechanically package. The signal paths tend to be relatively long due to the relatively long pins of the TO-cans and long leads of the FOTs, which can result in the EA having impedance matching issues, interference issues by external electromagnetic (EM) signals on the receiver side, and excessive EM emission issues on the transmitter side. Furthermore, the encapsulation of a FOT might crack or delaminate due to a large coefficient of thermal expansion (CTE) mismatch between the metal lead frame and the mold material.

It would be desirable to provide an EA in which the electrical circuits and other components of the ROSA, the TOSA and the optics are integrated together on a single PCB and encapsulated in a single molded EA package. Integrating the ROSA and the TOSA on a single PCB would reduce reliability issues associated with wire bonding and would allow signal path lengths and the overall size of the EA to be reduced. Furthermore, it would be desirable to provide an EA that is encapsulated in an encapsulation material having a CTE that is relatively close to the CTE of the PCB such that cracking and delamination due to temperature changes are avoided.

SUMMARY OF THE INVENTION

An EA and method of making an EA are provided. The EA comprises a circuit board having electrical conductors and one or more mounting surfaces, a transmitter mounted on the circuit board and electrically connected to one or more of the electrical conductors of the circuit board, a receiver mounted on the circuit board and electrically connected to one or more of the electrical conductors of the circuit board, and an optically transmissive encapsulation that encapsulates at least a portion of the circuit board. The transmitter includes at least a light source for producing optical signals and a transmitter IC for driving the light source. The receiver includes at least a photodetector and a receiver IC. The photodetector is configured to detect optical signals and to produce electrical signals corresponding to the detected optical signals. The receiver IC has circuitry configured to process electrical signals produced by the photodetector. The encapsulation provides a moisture barrier that prevents moisture from entering the encapsulated portion of the circuit board and provides mechanical protection of the EA.

The method for making the EA comprises providing a circuit board having electrical conductors and one or more mounting surfaces, mounting a transmitter on the circuit board, electrically connecting one or more of the electrical conductors of the circuit board, mounting a receiver on the circuit board, electrically connecting one or more of the electrical conductors of the circuit board to one or more electrical conductors of the receiver, and encapsulating at least a portion of the circuit board in an optically transmissive encapsulation.

These and other features and advantages of the invention will become apparent from the following description, drawings and claims.

DETAILED DESCRIPTION OF AN ILLUSTRATIVE EMBODIMENT

In accordance with the invention, an EA is provided in which the transmitter and the receiver components are integrated together on a single PCB, which is encapsulated in a single, molded EA package. The encapsulation material is an optically transmissive material having lenses and fiber alignment features formed therein. Integrating the transmitter and the receiver components on a single PCB allows the size and complexity of the EA to be greatly reduced as compared to the traditional TO-can and FOT architectures described above. The CTEs of the encapsulation material and of the PCB are relatively close in value, which allows problems such as delamination and cracking of the EA package due to temperature changes to be avoided or lessened. The method of the invention for manufacturing the EA package uses a standard semiconductor inline automation system and process that allows the EA packages to be mass produced with improved throughput, yield and quality as compared to the method currently used to manufacture and assemble the above described known EA.

Figure 1:
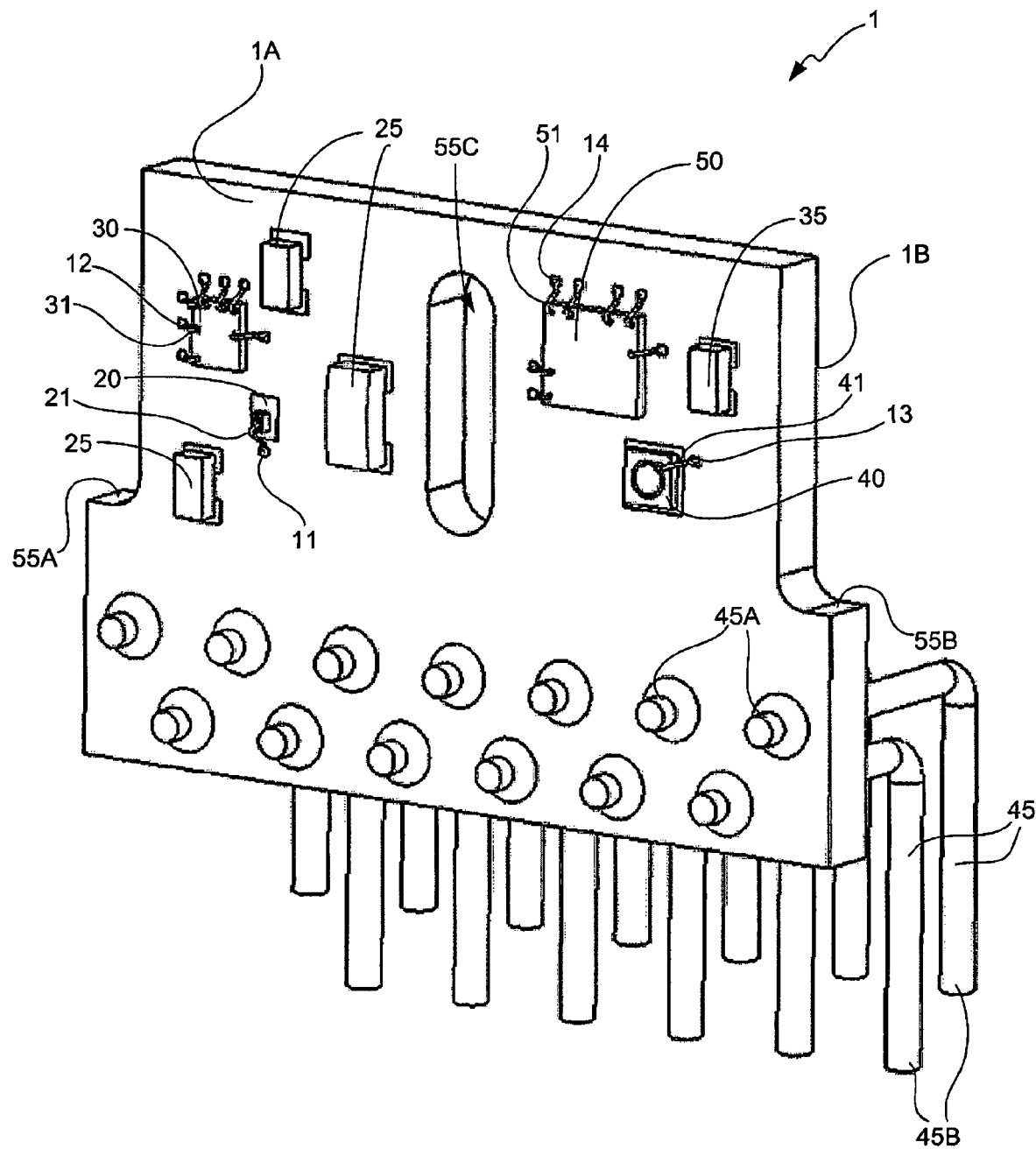
FIG. 1 illustrates a perspective view of a PCB having transmitter and receiver components mounted thereon and electrically thereto in accordance with an illustrative embodiment of the invention.

FIG. 1 illustrates a perspective view of a PCB 1 in accordance with an illustrative embodiment of the invention having transmitter and receiver components mounted on it and electrically interconnected with it. In the view shown in FIG. 1, the PCB 1 has not yet been encapsulated in the optically transmissive encapsulation material. The PCB 1 has a transmitter component 20 and a receiver component 40 mounted on a side 1A of the PCB 1. The component 20 corresponds to the light source, which may be a laser diode or LED, for example. The component 40 corresponds to a photodetector such as a photodiode, for example. The component 40 may be a photodetector other than a photodiode, although a photodiode is typically used for this purpose. The PCB 1 also has components 25, 30, 35, and 40 mounted on side 1A of the PCB 1 and electrically connected to the PCB 1. The components 25 correspond to passive components such as, for example, capacitors, inductors and/or resistors that are used to optimize the performance of the transmitter electronics. Component 30 corresponds to a transmitter IC. Component 35 is a passive component associated with the receiver electronics circuitry. The passive component 35 may be, for example, one or more capacitors, inductors and/or resistors used to optimize the performance of the receiver electronics. Component 40 corresponds to a receiver IC.

Although embodiments are being described herein with reference to mounting transmitter and receiver components on a PCB, the components may be mounted on any type of surface that is suitable for this purpose, including rigid circuit boards and flexible mounting surfaces. The term "circuit board" is used herein to denote all types of suitable mounting surfaces that may be used to for mounting and electrically interconnecting the transmitter and receiver components, including, but not limited to, multi-layer circuit boards having a minimum of two conductive planes (e.g., front and back conductive planes). Additionally, the term "circuit board" is used herein to denote conductive planes such as a ground plane added on top of a signal plane to shield it from electromagnetic interference.

As can be seen in FIG. 1, the light source 20 has a bond wire 21 that is wire bonded to a conductive contact pad 11 on the PCB 1. Likewise, the transmitter IC 30 has bond wires 31 that are wire bonded to conductive contact pads 12 on the PCB 1. Thus, in this example, the transmitter IC 30 is essentially a bare die that is wire bonded directly to the surface 1A of the PCB 1. The transmitter IC 30 may instead be a packaged IC (not shown) that is soldered directly to the opposite side 1B of the PCB 1 via use of a soldering reflow process. Therefore, both sides 1A and 1B of the PCB 1 may be utilized without reducing module reliability.

The photodiode 40 has a bond wire 41 that is wire bonded to a conductive contact pad 13 on the PCB 1. Likewise, the receiver IC 50 has wire bonds 51 that are wire bonded to conductive contact pads 14 on the PCB 1. Thus, in this example, the receiver IC 50 is essentially a bare die that is wire bonded directly to the surface 1A of the PCB 1. The receiver IC 50 may instead be a packaged IC (not shown) that is soldered directly to the opposite side 1B of the PCB 1 via use of a soldering reflow process, as will now be described with reference to FIG. 2.

Figure 2:
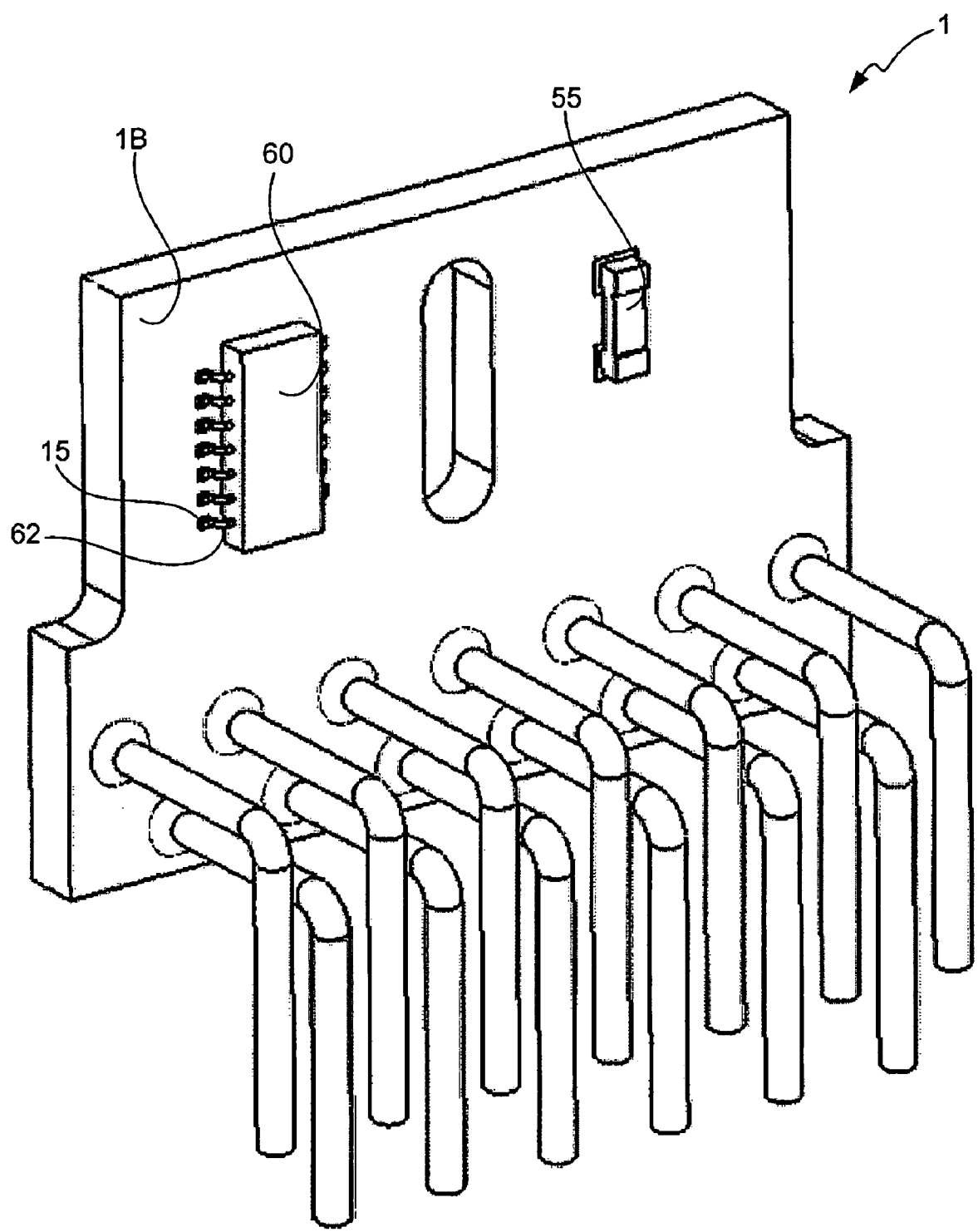
FIG. 2 illustrates a perspective view of the opposite side of the PCB shown in FIG. 1.

FIG. 2 illustrates a perspective view of the PCB 1 that shows side 1B of the PCB 1, which is opposite side 1A of the PCB 1 shown in FIG. 1. As indicated above, both sides 1A and 1B of the PCB 1 may be used for mounting components of the PCB 1. In FIG. 2, a controller IC 60 is mounted on side 1B of the PCB 1. The controller IC 60 is a packaged IC having a leadframe (not shown) with pins 62 that are soldered to conductive contact pads 15 on side 1B of the PCB 1. A passive component 65 is also shown mounted on side 1B of the PCB 1. The passive component 65 may be, for example, a capacitor, an inductor or a resistor.

With reference again to FIG. 1, elements 45 are conductors having contact points 45A on the surface 1A of the PCB 1 and contact points 45B that are intended to connect to contact points (not shown) on the customer board (not shown). The invention is not limited with respect to the number, shape or size of these elements 45, as those factors may change depending on customer requirements. The invention also is not limited with respect to the types of components that may be mounted on the PCB 1, and other components in addition to those shown in FIGS. 1 and 2 may be mounted on the PCB 1.

With reference to FIG. 1, slots 55A and 55B and opening 55C are formed in the PCB 1 to allow the encapsulation material (FIGS. 3A and 3B) on the sides 1A and 1B to pass into the slots 55A and 55B and the opening 55C forming permanent bonds between the encapsulation material covering side 1A and the encapsulation material covering side 1B. This bonding causes the encapsulation to clamp tightly to the PCB 1, which significantly increases the hold strength of the encapsulation and eliminates, or at least greatly reduces, the possibility of delamination or cracking of the EA package. Furthermore, as indicated above, the CTE of the molding compound used for the encapsulation and the CTE of the PCB substrate are relatively close in value, which further eliminates or reduces the possibility of delamination and cracking of the EA package due to temperature changes to be avoided or lessened.

Figure 3B:
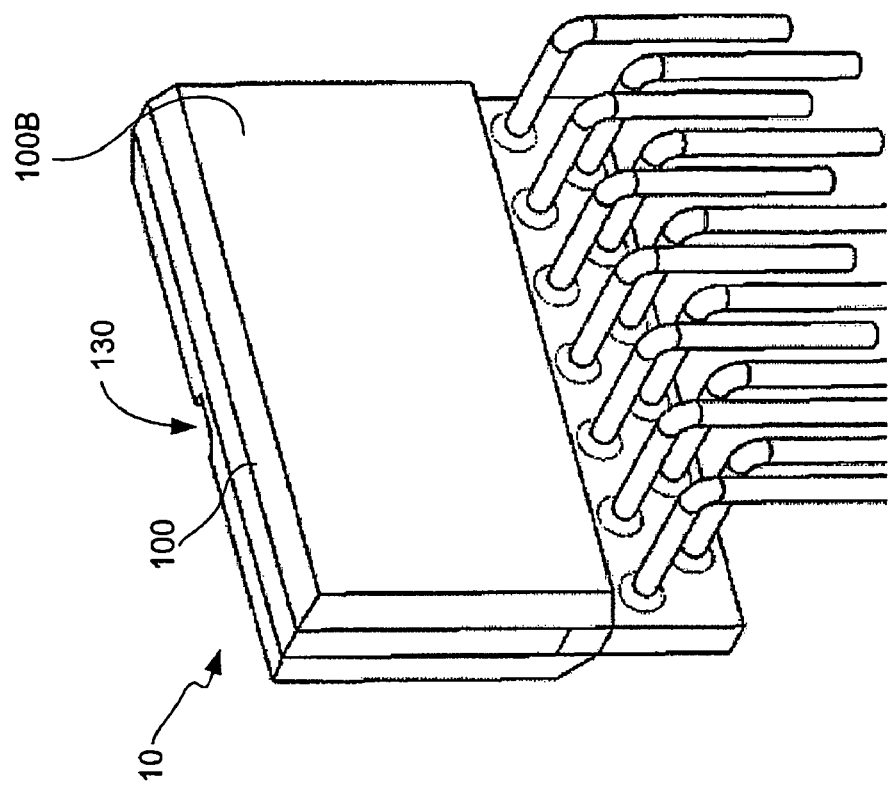
FIGS. 3A and 3B illustrate front and rear views, respectively, of the EA shown in FIG. 1 after the EA has been encapsulated in an optically clear molding compound.
Figure 3A:
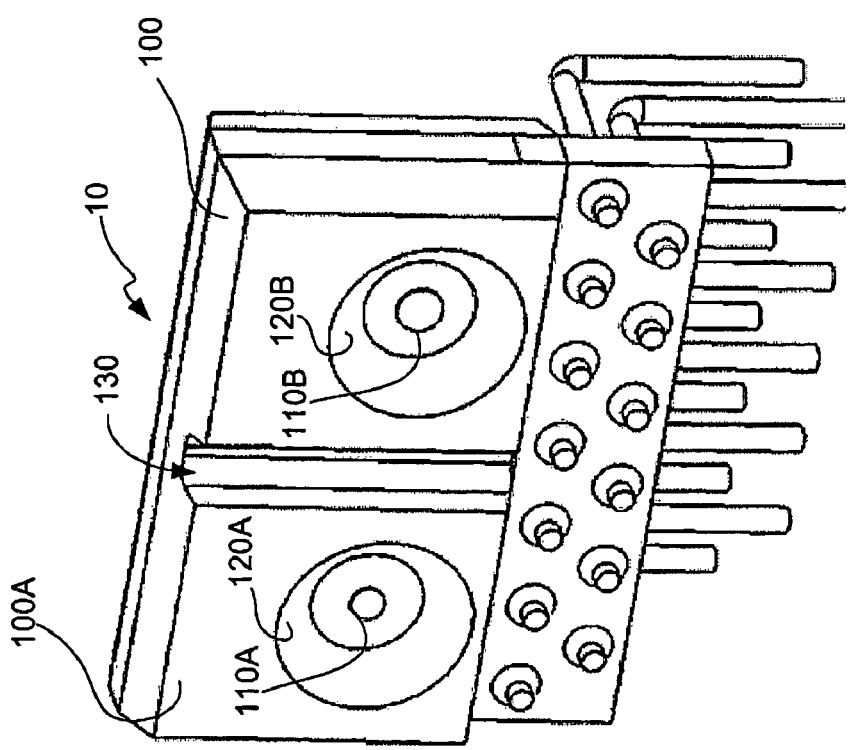

FIGS. 3A and 3B illustrate front and rear views, respectively, of the packaged EA 10 after the PCB 1 shown in FIGS. 1 and 2 has been encapsulated in an encapsulation 100 comprising an optically transmissive molding compound. The encapsulation 100 has an encapsulation portion 100A that covers side 1A of the PCB 1 and an encapsulation portion 100B that covers side 1B of the PCB 1. As indicated above with reference to FIG. 1, the portions 100A and 100B interconnect through slots 55A and 55B and through opening 55C. An important feature of the invention that helps make it feasible to place the transmitter and receiver components on a single PCB and package them in a single package is the fact that the package itself has fiber alignment features and lenses integrally formed therein. In particular, the encapsulation 100 is molded and includes dedicated lens surfaces 110A and 110B and fiber alignment features 120A and 120B. The lens surface 110A formed in the encapsulation 100 receives light output from the light source 20 (FIG. 1) and directs the received light into an end of a transmit optical fiber (not shown). The lens surface 110B formed in the encapsulation 100 receives light output from the end of a receive optical fiber (not shown) and directs the received light onto the photodiode 40 (FIG. 1).

The encapsulation 100 has an air gap 130 formed therein. As will be described below in detail with reference to FIGS. 8A and 8B, the air gap 130 is filled with a light absorbing material or an opaque mechanical device, which serves to prevent stray light from impinging on the photodiode.

The fiber alignment features 120A and 120B are tapered inward to allow the ends of the optical fibers to be passively aligned with the lenses 110A and 110B, respectively. One suitable material that may be used as the optically transmissive molding compound that forms the encapsulation 100 is a material sold by a company called Loctite under part number HYOSL MG97. Other materials are available that are also suitable for this purpose. As will be understood by persons of ordinary skill in the art, in view of the description being provided herein, the invention is not limited with respect to the material that is used for this purpose. The encapsulation 100 serves as an electrical isolation device and as a moisture barrier for all of the semiconductor components contained within the encapsulation 100 and also mechanically strengthens the EA 10.

By including the transmitter and receiver components in a single PCB package, a standard semiconductor inline automation system and process can be used to mass produce the packaged PCBs in a way that improves throughput, yield and quality as compared to the current processes that are used to manufacture the known EA comprising separate TO-cans or FOTs for the TOSA and ROSA mounted and wire bonded to the ESA PCB. The manner in which this is accomplished will now be described with reference to FIGS. 4-7.

Figure 4:
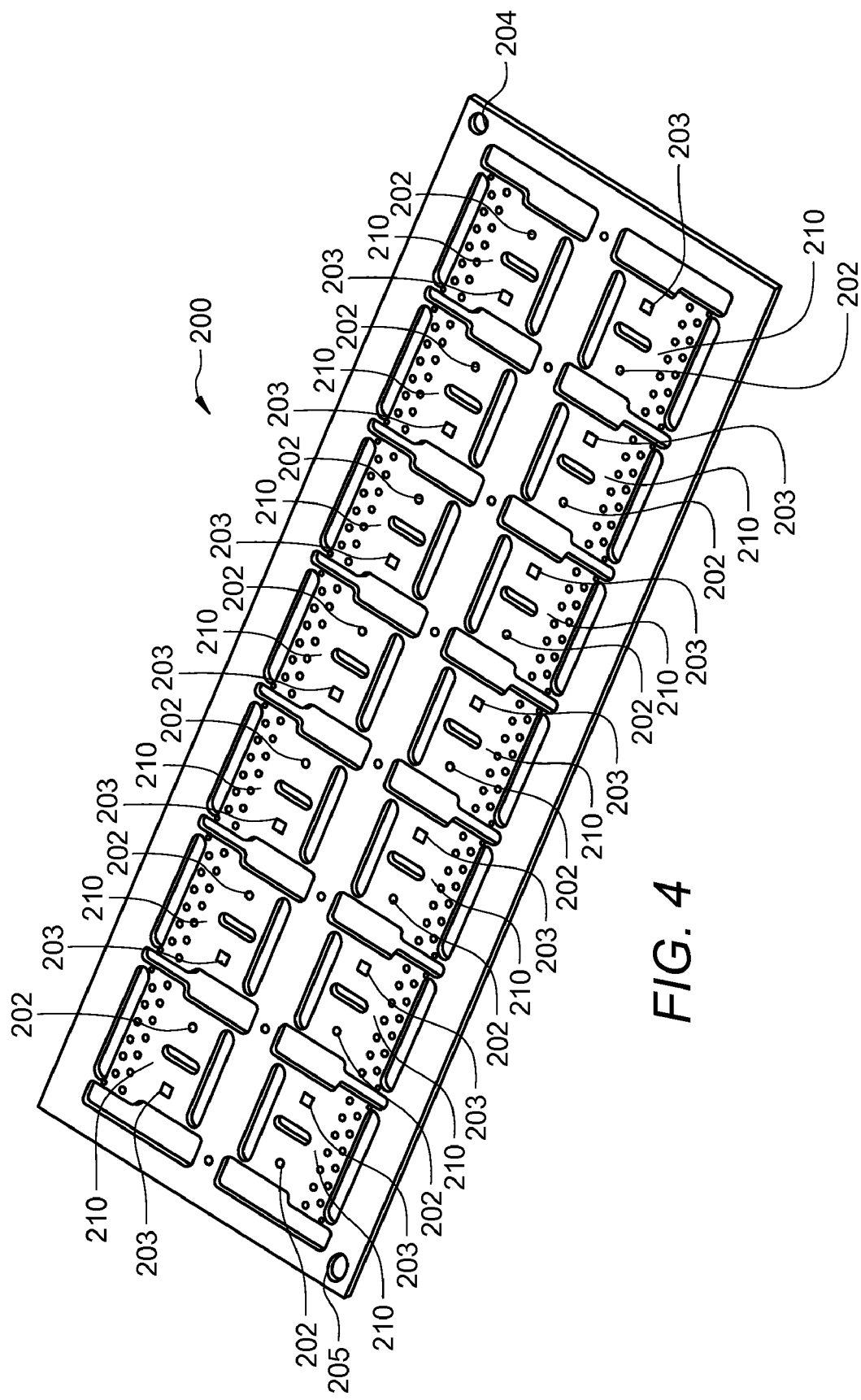
FIG. 4 illustrates a perspective view of a panelized strip of PCBs upon which the active and passive components described above with reference to FIGS. 1-3B will subsequently be mounted and encapsulated.

FIG. 4 illustrates a perspective view of a panelized strip 200 of PCBs 210 upon which the active and passive components described above with reference to FIGS. 1-3B will subsequently be mounted and encapsulated. The strip 200 includes a series of metalized fiducial markings 201 that have previously been deposited directly onto the strip 200 during fabrication of the strip 200. Rather than individual strips 200 being fabricated, a row containing many such strips 200 may be, and typically will be, fabricated.

During the die placement and attachment process, a machine vision system (not shown) on the die bonder (not shown) recognizes the fiducial markings 201 and uses them as reference positions to achieve high-accuracy placement of the light source and photodiode dies at locations 202 and 203, respectively. This high-accuracy placement ensures that the apertures of the light source and of the photodiode are within predefined tolerance ranges.

Figure 5:
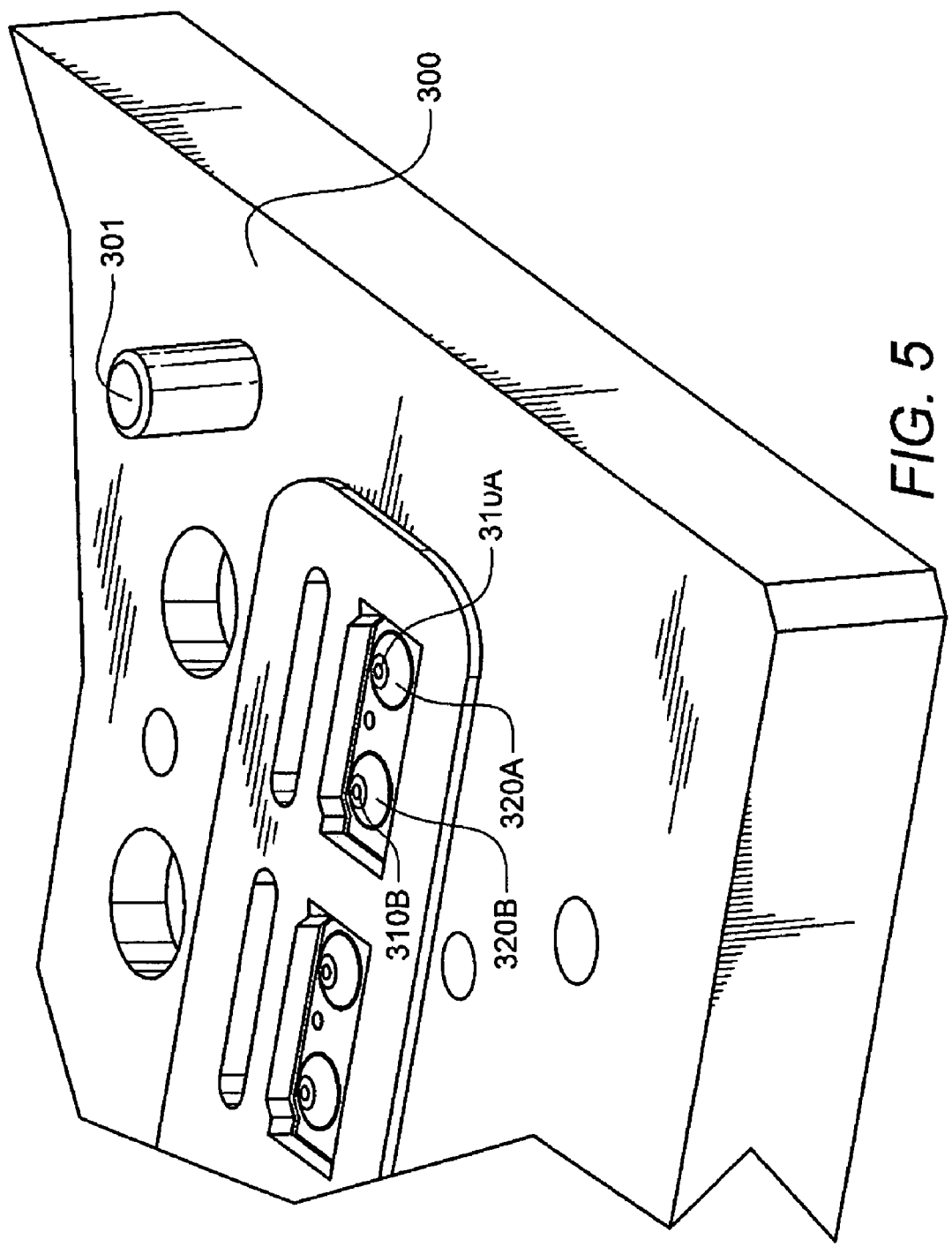
FIG. 5 illustrates a top perspective view of a molding tool that is used to form the lenses and the fiber alignment features shown in FIGS. 3A and 3B in the encapsulation material shown in FIGS. 3A and 3B.

FIG. 5 illustrates a top perspective view of a molding tool 300 that is used to form the lenses 110A and 110B (FIG. 3A) and the fiber alignment features 111A and 111B (FIG. 3A) in the encapsulation material 100 (FIG. 3A). With reference again to FIG. 4, the fiducial markings 201 are also used by the vision system to position a drill in order to drill an alignment hole 204 and a slot hole 205 through the strip 200. The alignment hole 204 is shaped and sized to receive a circular dowel pin 301 (FIG. 5) located on the molding tool 300 (FIG. 5), which accurately controls the positioning of PCB 210. The positions of the surfaces 310A, 310B and 320A, 320B that will be used to form the lenses 110A, 110B and the alignment features 120A, 120B, respectively, are machined by taking positional referencing from the dowel pin 301 to ensure that the surfaces 310A, 310B and 320A, 320B are in alignment with the respective apertures of the light source and photodiode within a predetermined tolerance range. The slot hole 205 formed in the panelized strip 200 (FIG. 4) is located diagonally to the hole 204 formed in the strip 200. The slot hole 205 is shaped and sized to receive a circular dowel pin (not shown) located on the molding tool 300 and to allows the circular dowel pin (not shown) to move horizontally inside of the slot hole 205 while constraining its vertical movement. This provides accurate control over the angle between PCB 210 to molding tooling 300. The diagonal locations of the circular hole 204 and the slot hole 205 relative to each other and the positioning of the respective pins in the holes 204 and 205 provides accurate positioning of the strip 200 and prevents rotational movement of the strip 200 during manufacturing of the PCBs 210.

Figure 6:
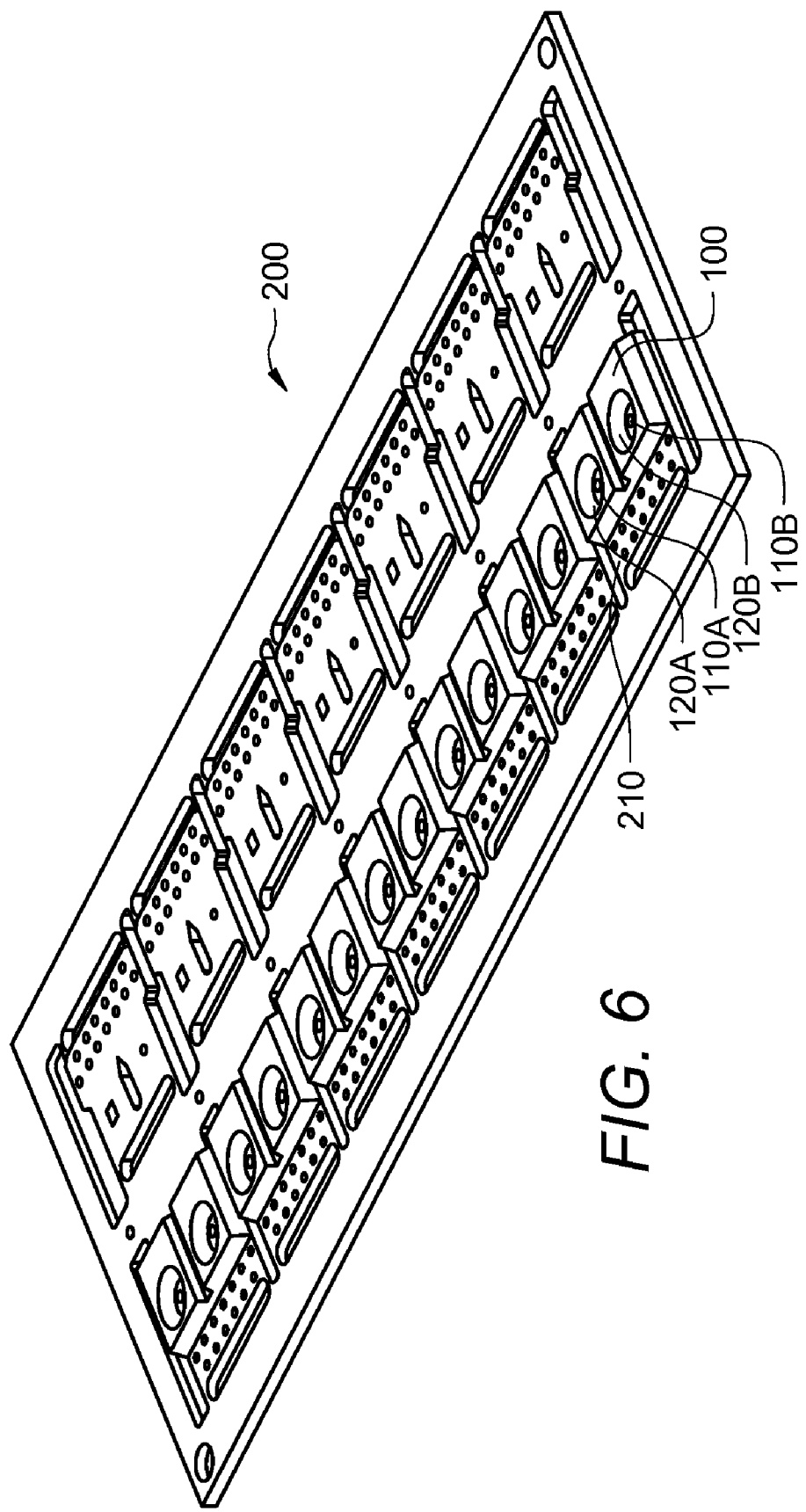
FIG. 6 illustrates a perspective view of the strip shown in FIG. 4 after the encapsulations having the lenses and fiber alignment features formed therein have been secured to the PCBs formed on the lower half of the strip.

FIG. 6 illustrates a perspective view of the strip 200 shown in FIG. 4 after the encapsulations 100 having the lenses 110A/110B and fiber alignment features 120A/120B formed therein have been placed on the PCBs 210 formed on the lower half of the strip 200. After the all of the PCBs 210 have been encapsulated in the encapsulations 100, a singulation process is performed to separate the encapsulated PCBs into the individual EAs 10 shown in FIGS. 3A and 3B.

Figure 7:
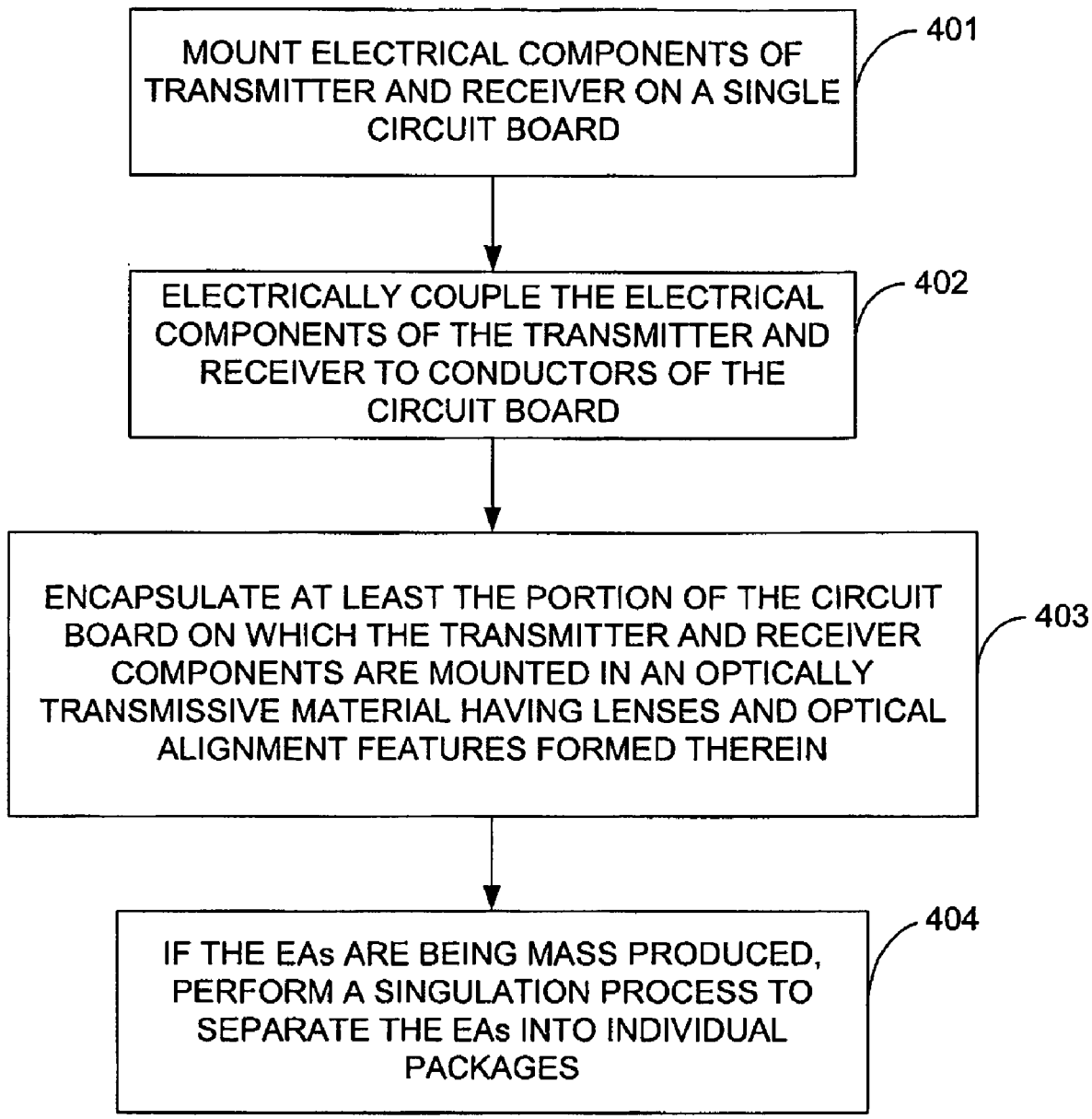
FIG. 7 illustrates a flowchart that represents the method in accordance with an illustrative embodiment for producing the EA of the invention.

FIG. 7 illustrates a flowchart that represents the method in accordance with an illustrative embodiment for producing the EA of the invention. Transmitter components, such as, for example, the light source, the transmitter IC and associated passive components, and receiver components, such as, for example, the photodiode, the receiver IC and associated passive components are mounted on a circuit board, as indicated by block 401. The transmitter components and the receiver components are electrically connected to electrical conductors of the circuit board, as indicated by block 402. The circuit board, or at least the portion of the circuit board on which the transmitter and receiver semiconductor components are mounted, is encapsulated in the optically transmissive molding material, as indicated by block 403. The lenses and the fiber alignment features (FIG. 3A) are typically formed during the encapsulation process represented by block 403, although they could be formed before or after the encapsulation process. In the case where the EAs are mass produced, as described above with reference to FIGS. 4-6, after the encapsulation step, a singulation process is performed to separate the EAs into individual packages, as indicated by block 404. Of course, the method represented by blocks 401-403 could be performed to produce a single EA package, in which case the singulation process represented by block 404 would not need to be performed.

Figure 8A:
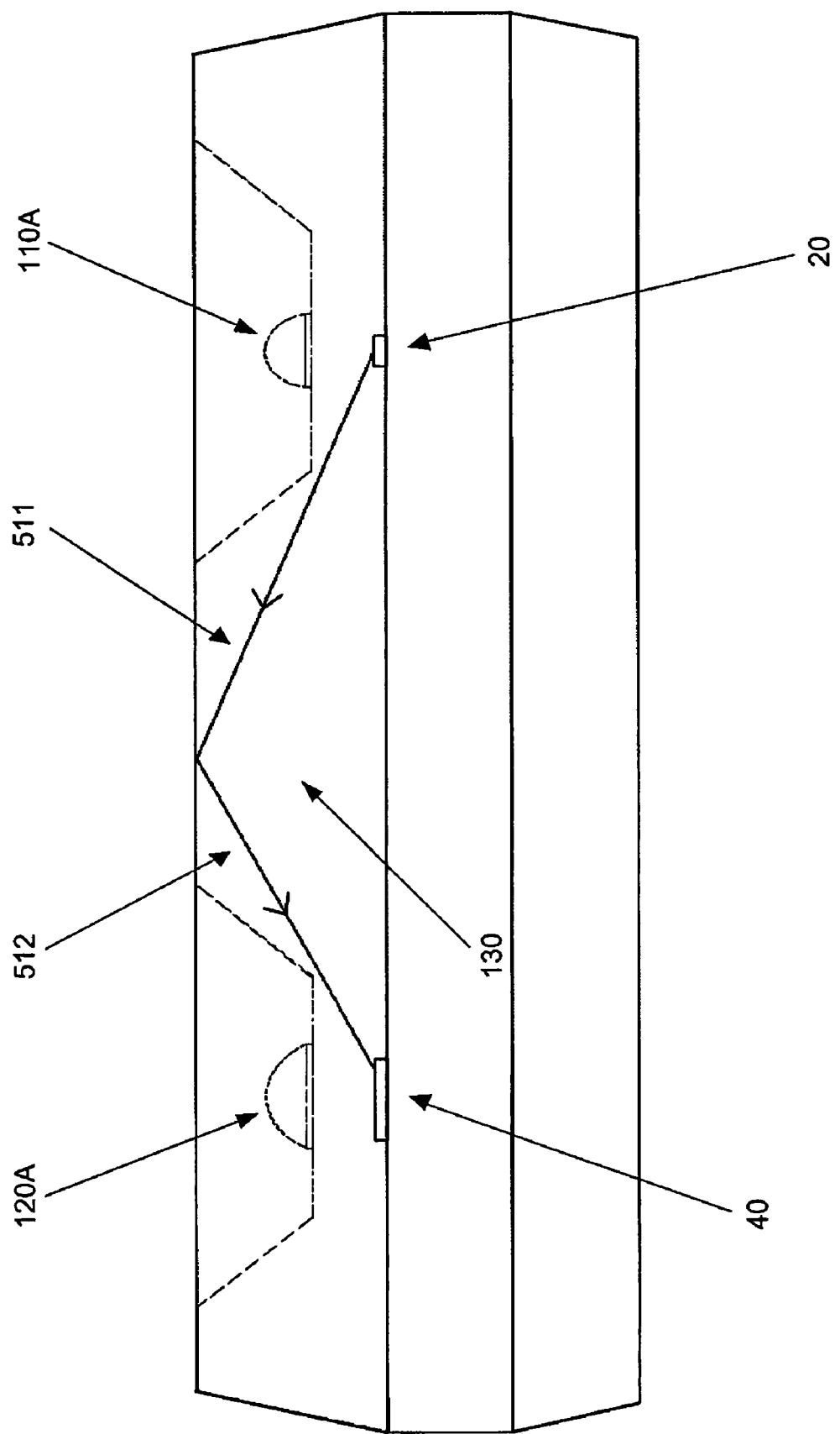
FIGS. 8A and 8B illustrate cross-sectional top views of the encapsulated EA shown in FIG. 3A before and after, respectively, the air gap has been filled with a light-absorbing or light material.
Figure 8B:
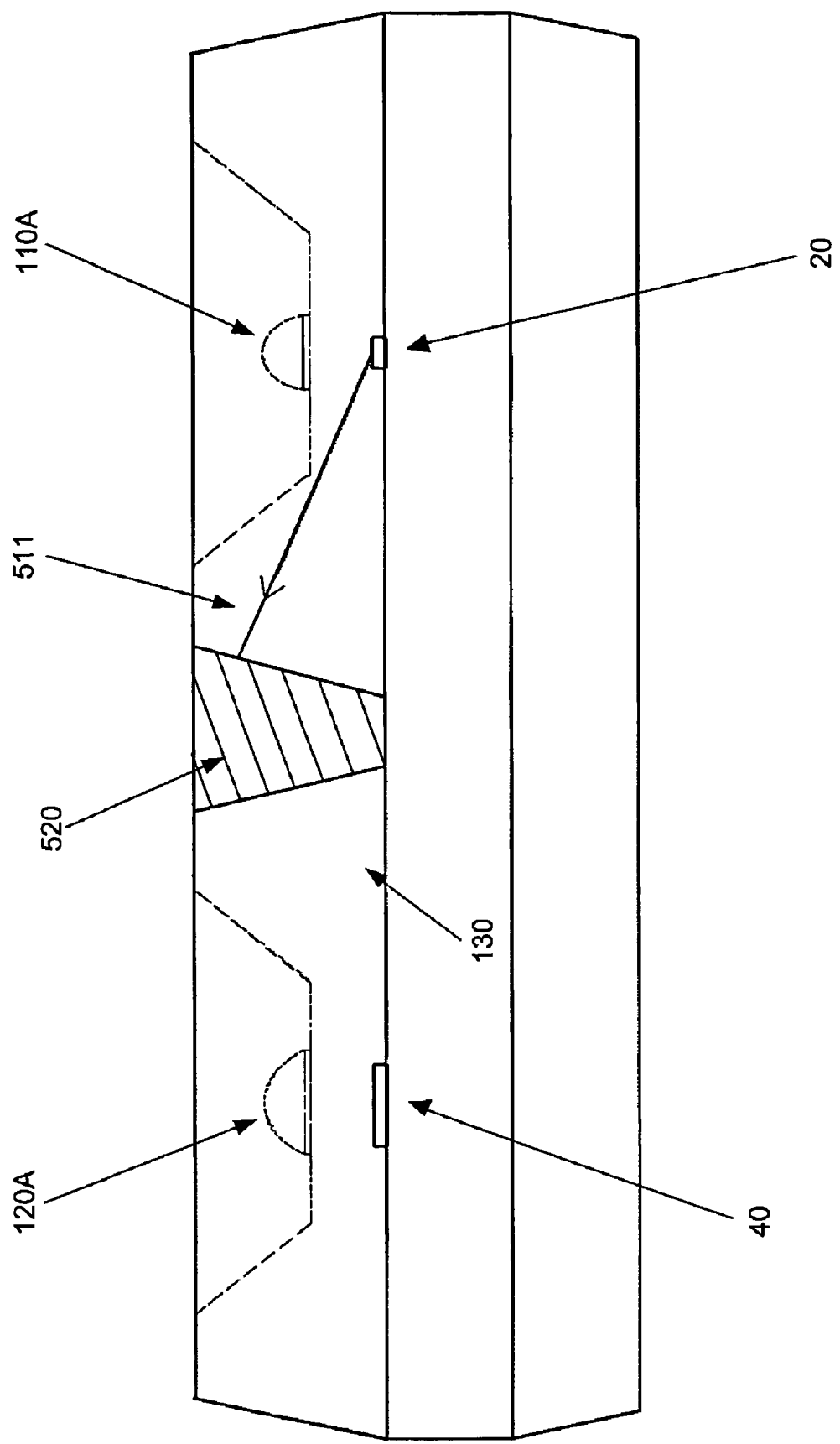

FIGS. 8A and 8B illustrate cross-sectional top views of the encapsulated EA 10 shown in FIG. 3A before and after, respectively, the air gap 130 has been filled with a light-absorbing or opaque light-blocking material 520. As described above with reference to FIG. 3A, forming the air gap 130 in the molded package 100 and filling the air gap 130 with a light-absorbing or light-blocking material prevents stray light from impinging on the photodiode 40 (FIG. 1). In FIG. 8A, it is shown that in the absence of such a light absorbing/blocking device, some light produced by the light source 20 may be internally reflected at the surface of the encapsulation 100 and impinge on the photodiode 40, which results in optical interference between transmitter and receiver, commonly known as optical crosstalk. The line 511 represents stray light directly from the light source 20, whereas line 512 represents the stray light after it has been internally reflected at the interface of the encapsulation 100 and the surrounding air. The reflected stray light 512 impinges on the photodiode 40. As shown in FIG. 8B, the air gap 130 filled with the light-absorbing or light-blocking material 520 forms a light-absorbing or light-blocking device that prevents stray light from reaching the photodiode 40.

It should be noted that the invention has been described with reference to a few illustrative embodiments in order to demonstrate the principles and concepts of the invention. The invention, however, is not limited to the embodiments described herein, as will be understood by persons of ordinary skill in the art in view of the description provided herein. For example, although the invention has been described with reference to mounting TOSA and ROSA components on a PCB, any type of suitable mounting surface may be used for this purpose. These and many other modifications may be made to the embodiments described herein while still achieving the goals of the invention, and all such modifications are within the scope of the invention.

What is claimed is:

1. An electro-optical assembly (EA) comprising:
    a circuit board having electrical conductors and one or more mounting surfaces;
    a transmitter mounted on the circuit board and electrically connected to one or more of the electrical conductors of the circuit board, the transmitter including at least a light source for producing optical signals and a transmitter integrated circuit (IC) for driving the light source;
    a receiver mounted on the circuit board and electrically connected to one or more of the electrical conductors of the circuit board, the receiver including at least a photodetector and a receiver IC, the photodetector being configured to detect optical signals and to produce electrical signals corresponding to the detected optical signals, the receiver IC having circuitry configured to process electrical signals produced by the photodetector; and
    an optically transmissive encapsulation that encapsulates at least a portion of the circuit board, the encapsulated portion of the circuit board including at least the transmitter and the receiver, the encapsulation providing a moisture barrier that prevents moisture from entering the encapsulated portion of the circuit board and providing mechanical protection of the EA;
    a first optical element formed in the optically transmissive encapsulation at a location adjacent the photodetector, the first optical element having a shape configured for receiving an end of a receive optical fiber and for passively aligning the end of the receive optical fiber with the photodetector, wherein the shape of the first optical element includes a first lens surface that is in proximity to the photodetector for coupling optical signals passing out of the end of the receive optical fiber onto the photodetector; and
    a second optical element formed in the optically transmissive encapsulation at a location adjacent the light source, the second optical element having a shape configured for receiving an end of a transmit optical fiber and for passively aligning the end of the transmit optical fiber with the light source, wherein the shape of the second optical element includes a second lens surface that is in proximity to the light source for coupling optical signals produced by the light source onto the end of the transmit optical fiber.

2. The EA of claim 1, wherein the photodetector is a photodiode.

3. The EA of claim 1, wherein the light source is a laser diode.

4. The EA of claim 1, wherein the light source is a light emitting diode (LED).

5. The EA of claim 1, wherein the first and second optical elements are molded into the optically transmissive encapsulation.

6. The EA of claim 5, wherein the encapsulation extends through one or more openings formed in the circuit board mechanically coupling a portion of the encapsulation covering a front side of the circuit board with a portion of the encapsulation covering a back side of the circuit board.

7. The EA of claim 1, wherein the optically transmissive encapsulation has a light absorbing device formed therein that extends between the light source and the photodetector, the light absorbing device comprising an air gap filled with a light absorbing material, and wherein the light absorbing device prevents light produced by the light source from impinging on the photodetector.

8. The EA of claim 1, wherein the optically transmissive encapsulation has a light absorbing device formed therein that extends between the light source and the photodetector, the light absorbing device comprising an air gap having an opaque material therein, and wherein the light absorbing device prevents light produced by the light source from impinging on the photodetector.

9. A method for making an electro-optical assembly (EA) comprising:
    providing a circuit board having electrical conductors and one or more mounting surfaces;
    mounting a transmitter on the circuit board, the transmitter including at least a light source for producing optical signals and a transmitter integrated circuit (IC) for driving the light source;
    electrically connecting one or more of the electrical conductors of the circuit board to one or more electrical conductors of the transmitter;
    mounting a receiver on the circuit board, the receiver including at least a photodetector and a receiver IC;
    electrically connecting one or more of the electrical conductors of the circuit board to one or more electrical conductors of the receiver, the photodetector being configured to detect optical signals and to produce electrical signals corresponding to the detected optical signals, the receiver IC having circuitry configured to process electrical signals produced by the photodetector; and
    encapsulating at least a portion of the circuit board in an optically transmissive encapsulation, the encapsulated portion of the circuit board including at least the transmitter and the receiver, the encapsulation providing a moisture barrier that prevents moisture from entering the encapsulated portion of the circuit board, the optically transmissive encapsulation having first and second optical elements formed therein, the first optical element being at a location adjacent the photodetector and having a shape configured for receiving an end of a receive optical fiber and for passively aligning the end of the receive optical fiber with the photodetector, wherein the shape of the first optical element includes a first lens surface that is in proximity to the photodetector for coupling optical signals passing out of the end of the receive optical fiber onto the photodetector, the second optical element being at a location adjacent the light source and having a shape configured for receiving an end of a transmit optical fiber and for passively aligning the end of the transmit optical fiber with the light source, wherein the shape of the second optical element includes a second lens surface that is in proximity to the light source for coupling optical signals produced by the light source onto the end of the transmit optical fiber.

10. The method of claim 9, further comprising:
using the shape of the first optical element to passively align an end of a receive optical fiber to the first optical element such that the end of the receive optical fiber is adjacent the first lens surface.

11. The method claim 10, further comprising:
using the shape of the second optical element to passively align an end of a transmit optical fiber to the second optical element such that the end of the transmit optical fiber is adjacent the second lens surface.

12. The method of claim 11, wherein the photodetector is a photodiode.

13. The method of claim 12, wherein the light source is a laser diode.

14. The method of claim 12, wherein the light source is a light emitting diode (LED).

15. The method of claim 9, wherein the optically transmissive encapsulation has a light absorbing device formed therein that extends between the light source and the photodetector, the light absorbing device comprising an air gap filed with a light absorbing material, and wherein the light absorbing device prevents light produced by the light source from impinging on the photodetector.

16. The method of claim 9, wherein the optically transmissive encapsulation has a light absorbing device formed therein that extends between the light source and the photodetector, the light absorbing device comprising an air gap having an opaque material therein, and wherein the light absorbing device prevents light produced by the light source from impinging on the photodetector.

* * * * *